United States Patent [19]

Ogawa et al.

[11] Patent Number: 5,097,447
[45] Date of Patent: Mar. 17, 1992

[54] SEMICONDUCTOR MEMORY DEVICE HAVING A SERIAL ACCESS MEMORY

[75] Inventors: Hiroaki Ogawa, Nagoya; Masaaki Noguchi, Seto, both of Japan

[73] Assignees: Fujitsu Limited, Kawasaki; Fujitsu VLSI Limited, Kasugai, both of Japan

[21] Appl. No.: 408,028

[22] Filed: Sep. 15, 1989

[30] Foreign Application Priority Data

Sep. 20, 1988 [JP] Japan ................. 63-235697

[51] Int. Cl.⁵ ............................................. G11C 7/00
[52] U.S. Cl. .................................. 365/200; 365/221; 365/230.09; 365/236; 365/239; 365/241; 371/10.2
[58] Field of Search ............... 365/230.09, 200, 236, 365/241, 239, 221; 371/10.2

[56] References Cited

U.S. PATENT DOCUMENTS

| | | | |
|---|---|---|---|
| 4,292,674 | 9/1981 | Scheuneman | 365/230.09 |
| 4,817,056 | 3/1989 | Furutani et al. | 365/200 |
| 4,823,302 | 4/1989 | Christopher | 365/221 |
| 4,858,192 | 8/1989 | Tatsumi et al. | 365/200 |
| 4,870,621 | 9/1989 | Nakada | 365/230.09 |
| 4,885,720 | 12/1989 | Miller et al. | 365/200 |
| 4,885,721 | 12/1989 | Katanosaka | 365/200 |
| 4,890,262 | 12/1989 | Hashimoto et al. | 365/200 |
| 4,891,794 | 1/1990 | Hush et al. | 365/230.09 |

Primary Examiner—Joseph E. Clawson, Jr.
Attorney, Agent, or Firm—Armstrong, Nikaido, Marmelstein, Kubovcik & Murray

[57] ABSTRACT

A semiconductor memory device includes a RAM and a serial access memory (SAM). The SAM includes an address counter which generates a slave address and a master address. The slave address precedes the master address by half the period of a serial access strobe signal. A redundancy decision is made by comparing the slave address with a redundancy address. When the master address is supplied to a data register provided in the SAM, the decision result is available. That is, the SAM can be accessed immediately after the master address is supplied thereto.

20 Claims, 12 Drawing Sheets

SEMICONDUCTOR MEMORY DEVICE HAVING A SERIAL ACCESS MEMORY

BACKGROUND OF THE INVENTION

The present invention generally relates to a semiconductor memory device, and more particularly to a semiconductor memory device having a serial access memory.

Generally, an image memory used in the field of image processing has two ports; a random port and a serial port. The random port is connected to a central processing unit (hereinafter simply referred to as a CPU), and the serial port is connected to a display device such as a cathode-ray tube display device. The access speed at the serial port is desired to be as fast as possible since it directly influences the image displaying speed. Particularly, there is a need to use a higher-access speed image memory as an image memory used for high-speed image processing for drawing pictures at high speeds.

Referring to FIG. 1, there is illustrated a conventional semiconductor memory device having a serial access memory. Referring to FIG. 1, a semiconductor memory device 1 includes a random access memory (hereinafter simply referred to as a RAM) 2, and a serial access memory (hereinafter simply referred to as a SAM) 3. The RAM 2 includes memory cells located at intersecting points where word lines and bit lines intersect. One of the word lines is selected by a row address supplied from an external device such as a CPU, and one of the bit lines is selected by a column address supplied therefrom. The SAM 3 is made up of an address counter 3a, a redundancy decision circuit 3b, a data register 3c, and an input/output buffer 3d. The address counter 3a inputs, as an initial address value for serial access, the column address in synchronism with a rise of a serial access strobe signal SAS, and generates a corresponding serial access address $SA_{AD}$. The redundancy decision circuit 3b compares the serial access address $SA_{AD}$ with a predetermined redundancy address, and outputs a redundancy switching signal SOM when the compared addresses are identical to each other. The data register 3c has storage (register) cells and redundancy cells amounting to one line of the RAM 2. The storage cells are accessed one by one in series in synchronism with the redundancy address $SA_{AD}$. When the redundancy switching signal SOM is supplied to the data register 3c, the redundancy cells are accessed. The serial input/output buffer 3d connects the data register 3c and an input/output terminal 4 in the bidirection.

However, the conventional device as shown in FIG. 1 presents the following disadvantages. The address counter 3a inputs the column address labelled $C_{AD}$ in synchronism with a rise of the serial access strobe signal SAS, as shown in FIG. 3(B). In other words, a timing with which the column address is input corresponds to the rise of the serial access strobe signal SAS. Then the address counter 3a outputs the serial access address $SA_{AD}$, and then the redundancy decision circuit 3b outputs the redundancy switching signal SOM to the data register 3c. Thus, the serial access speed of the device is not so high.

It is inevitable that a large storage capacity memory device is configured so as to have a redundancy structure and therefore redundancy decision procedure is necessarily required. In the redundancy decision procedure, an address for cells requested to be accessed is compared with the redundancy address which is programmed information indicative of defective cells, and a decision is made based on whether both the addresses are the same. It is noted that the above-mentioned redundancy decision procedure cannot be done until the address of cells requested for accessing, that is, the serial access address $SA_{AD}$ is settled. In the above-mentioned manner, the serial access cannot be done until the serial access address $SA_{AD}$ is settled and then the redundancy decision procedure is executed. Even when the length of a period of the serial access strobe signal SAS is reduced in order to speed up the serial access, there is a limit on the possible length of period due to a time necessary for the settlement of the serial access address $SA_{AD}$ and the redundancy decision procedure. The above description holds true for an alternative in which the column address $C_{AD}$ is input in the address counter 3a in synchronism with a fall of the serial access strobe signal SAS.

SUMMARY OF THE INVENTION

Accordingly, a general object of the present invention is to provide an improved semiconductor memory device having a serial access memory in which the aforementioned disadvantages are eliminated.

Another object of the present invention is to provide a higher-speed semiconductor memory device having a serial access memory in which serial access is done immediately after the serial access signal falls or rises, or in other words, the column address is input in the address counter so that the length of a period of the serial access signal can be reduced and serial access speed can be increased.

The above objects of the present invention can be achieved by a semiconductor memory device comprising a random access memory including a plurality of memory cells and parallel read/write means for writing data and reading data into and from the memory cells on the basis of address information, and a serial access memory coupled to the random access memory. The serial access memory comprises a data register device for storing data to be written into or read from the random access memory and to be input from or output to an external signal line in serial form; The data register device includes a first group of register cells and a second group of redundancy cells, first address generating device for generating a first serial access address starting from an initial address supplied from an external device, and second address generating device, coupled to the first address generating device, for inputting the first serial access address and generating a second serial access address to be supplied to the data register device. The first serial access address has the same contents as the second serial access address and precedes the second serial access address by a predetermined time. The serial access memory further comprises a redundancy decision device, coupled to the first address generating device, for determining whether the first serial access address is the same as a redundancy address. A selecting device is coupled to the redundancy decision device for selecting one of the first and second groups of the data register device on the basis of the comparison result supplied from the redundancy decision device. The data registered in the data register device is accessed in serial form by the second serial access address. When the second serial access address is supplied to the data register device, the data is input in or output from the data register device in series.

The aforementioned objects of the present invention can also be achieved by a semiconductor memory device comprising a random access memory including a plurality of memory cells and parallel read/write device for writing data and reading data into and from the memory cells on the basis of address information, and a serial access memory coupled to the random access memory. The address information is divided into groups each composed of a predetermined number of address bits. The serial access memory comprises a data register device for storing data to be written into or read from the random access memory and to be input from or output to an external signal line in serial form. The data register device includes a first group of register cells and a second group of redundancy cells, first address generating device, provided for each of the groups of address bits, for generating a part of a first serial access address starting from an initial address for corresponding one of the groups of address bits supplied from an external device, and second address generating device, provided for each of the groups of address bits and coupled to the related first address generating device, for inputting the related part of the first serial access address and generating a part of a second serial access address to be supplied to the data register device. The first serial access address has the same contents as the second serial access address and precedes the second serial access address by a predetermined time. The serial access memory further comprises redundancy decision device, provided for each of the groups of address bits and coupled to the first address generating device, for determining whether the part of the first serial access address is the same as a corresponding part of a redundancy address. A selecting device is coupled to the redundancy decision device, for selecting one of the first and second groups of the data register device on the basis of the comparison results supplied from the redundancy decision device provided for the groups of address bits. The data registered in the data register device is accessed in serial form by the second serial access address. When the second serial access address is supplied to the data register device, the data is input in or output from the data register device in series.

The aforementioned objects of the present invention can also be achieved by a semiconductor memory device comprising a memory cell array including a plurality of memory cells, redundancy memory cells replaceable by defective memory cells contained in the memory cell array, a data register coupled to the memory cell array and including a plurality of register cells, the data register storing a plurality of bits read out from the memory cell array, a redundancy register coupled to the redundancy memory cells and storing data read out from the redundancy memory cells, selecting device for selecting one register cell from among the plurality of register cells on the basis of a serial access address, first address generating device, coupled to the selecting device, for sequentially generating the serial access address, second address generating device, coupled to the first address generating device, for sequentially generating the serial access address prior to the first address generating device, device for determining whether the serial access address generated by the second address generating device coincides with an address indicative of one of the redundancy memory cells, and output device, coupled to the data register and the redundancy register, for outputting the data stored in the redundancy register in place of data stored in the data register when the device detects the coincidence.

The aforementioned objects of the present invention can also be achieved by a semiconductor memory device comprising a register including a plurality of data registers and storing data composed of a plurality of bits to be output in serial form, output device for sequentially designating the plurality of data registers and sequentially outputting the plurality of bits, a redundancy register replaceable by one of the plurality of data registers, address generating device for simultaneously generating a first address for sequentially designating the plurality of data registers and a second address corresponding to an address obtained by incrementing the first address by +1, detecting device for detecting the coincidence of the second address and a predetermined address, and switching device for responding to the detected coincidence and selecting data stored in the redundancy register in place of the one of the data registers.

Additional objects, features and advantages of the present invention will be apparent from the following detailed description when read in conjunction with the accompanying drawings.

DESCRIPTION OF THE PREFERRED EMBODIMENTS

Figure 2:
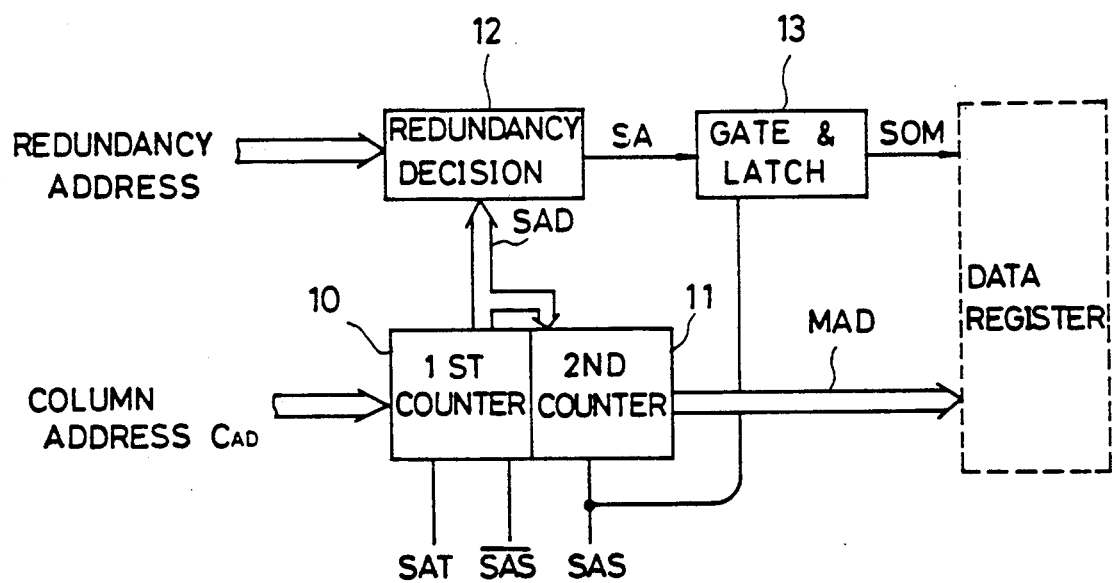
FIG. 2 is a block diagram of the principle of the present invention.

A description is given of the principle of the present invention with reference to FIG. 2. The configuration shown in FIG. 2 corresponds to a serial access memory provided in a semiconductor memory device according to the present invention. The illustrated configuration includes a first counter 10, a second counter 11, a redundancy decision circuit 12, and a gate and latch circuit 13. The first counter 10 is supplied with a column address $C_{AD}$, an initial counter address setting signal SAT, and an inverted serial access strobe signal $\overline{SAS}$. The signal SAT is supplied from an external device such as a CPU. The inverted serial access strobe signal $\overline{SAS}$ is generated in the semiconductor memory device, and is 180 degrees out of phase with the serial access strobe signal SAS which is supplied to the second counter 11 and the gate and latch circuit 13. The signal $\overline{SAS}$ rises at the same time as the signal $\overline{SAS}$ falls or vice versa. The first and second counters 10 and 11 configure a master-slave type flip-flop in which the first and second counters 10 and 11 serve as a master counter and a slave counter, respectively. When the inverted serial access strobe signal SAS rises while the initial counter address setting signal SAT is "H", the first counter 10 inputs the column address $C_{AD}$ therein as the initial address. The input column address is output to the second counter 11 as a slave address signal SAD. The second counter 11 inputs the slave address signal SAD in synchronism with the rise of the serial access strobe signal SAS, and then outputs the slave address signal SAD as a master address signal MAD. As will be described later, the slave address SAD precedes the master address MAD by half the period of the serial access strobe signal SAS. The first counter 10 counts up the column address $C_{AD}$ and outputs the slave address signal SAD each time the inverted serial access strobe signal $\overline{SAS}$ rises.

Figure 1:
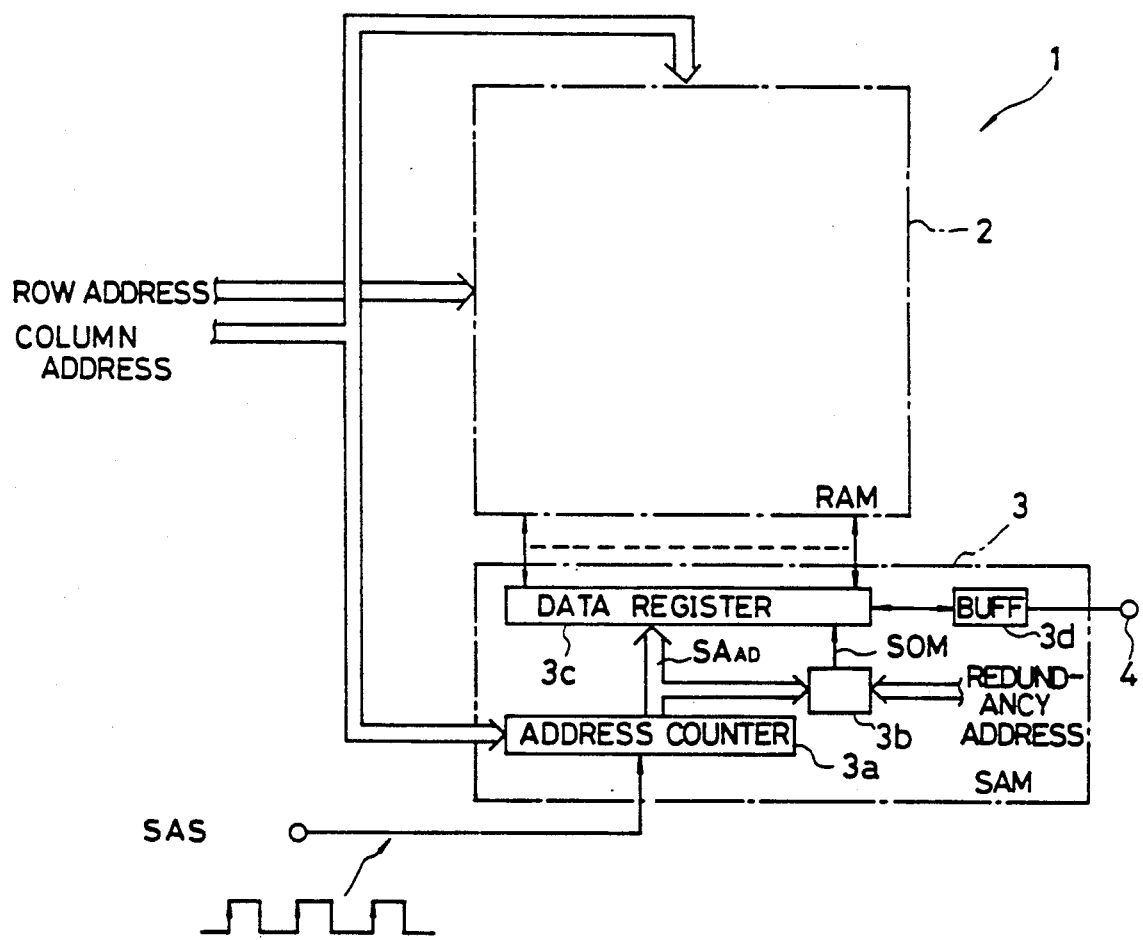
FIG. 1 is a block diagram of a conventional semiconductor memory device having a serial access memory.
Figure 3A:
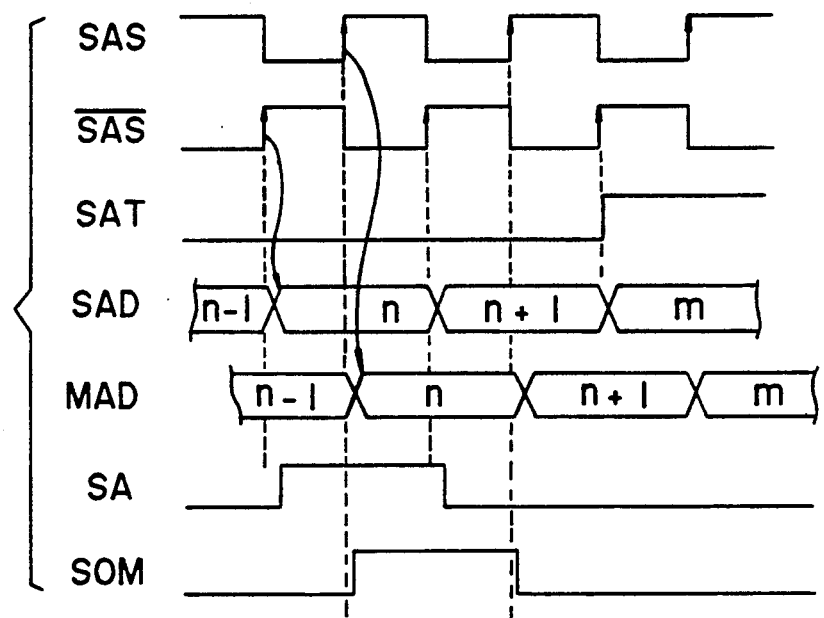
FIGS. 3(A)-3(B) are timing charts of signals observed in the configuration shown in FIG. 2 and the conventional device shown in FIG. 1.

Referring to a timing chart of FIG. 3(A), the slave address signal SAD derived from the first counter 10 is renewed each time the inverted serial access strobe signal $\overline{SAS}$ rises, that is, each time the serial access strobe signal SAS falls. The master address MAD derived from the second counter 11 is renewed each time the serial access strobe signal SAS rises. The redundancy decision circuit 12 makes a decision on redundancy on the basis of the slave address SAD and the redundancy address supplied from a read only memory (not shown in FIG. 2) provided in the semiconductor memory device. The redundancy decision procedure is started before the serial access strobe signal SAS rises. The redundancy decision circuit 12 outputs a signal SA which indicates the decision result when both the input addresses are the same. When the serial access strobe signal SAS rises, the gate and latch circuit 13 is made open whereby it passes the signal SA as the redundancy switching signal SOM. At almost the same time, the master address MAD is output from the second counter 11. When a data register corresponding to the data register 3c shown in FIG. 1 is being accessed by the master address MAD and the redundancy switching signal SOM is being output, one of the redundancy cells provided in the data register is selected and the serial access to the selected redundancy cell is executed. Thus, the serial access is started immediately after the master address MAD and the serial access strobe signal SAS are supplied to the data register. As a result, it is possible to reduce the period of the serial access strobe signal SAS so that the serial access speed can be increased.

Figure 3B:
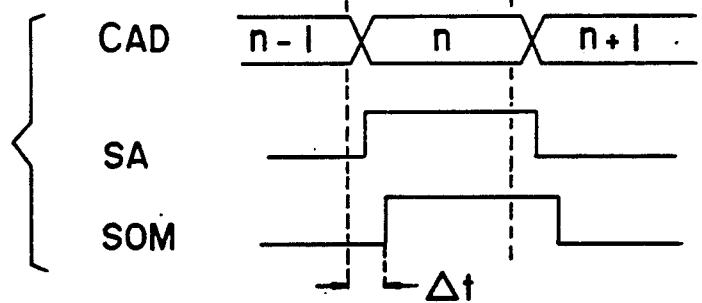

In the case of FIG. 3A, it should be appreciated that the decision result SA for the address 'n' is obtained by almost a half of the period than the master address MAD corresponding to the address $SA_{AD}$ is incremented to the address 'n', and the redundancy switching signal SOM (the decision result) is obtained at almost the same time as the master address MAD is changed to the address 'n'. As a result, as shown in FIG. 3, the serial access speed is $\Delta t$ faster than the serial access speed of the conventional device per once addressing.

Figure 4:
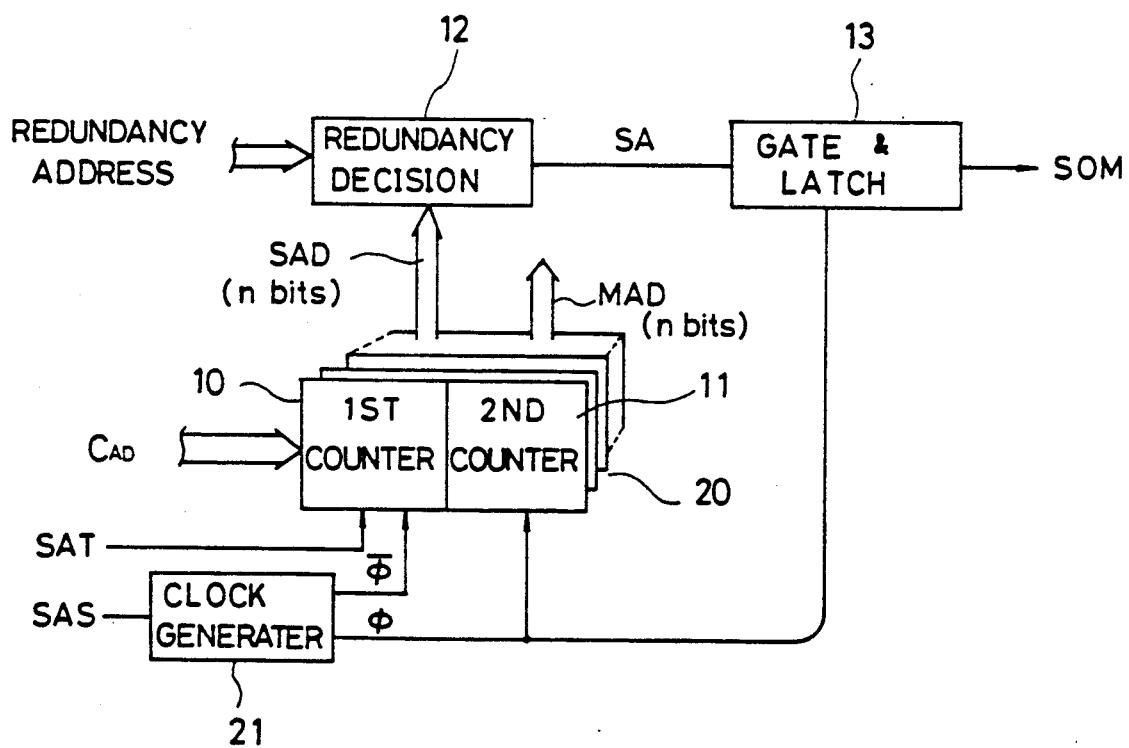
FIG. 4 is a block diagram of a fundamental structure of the invention which handles a plurality of address bits.
Figure 5:
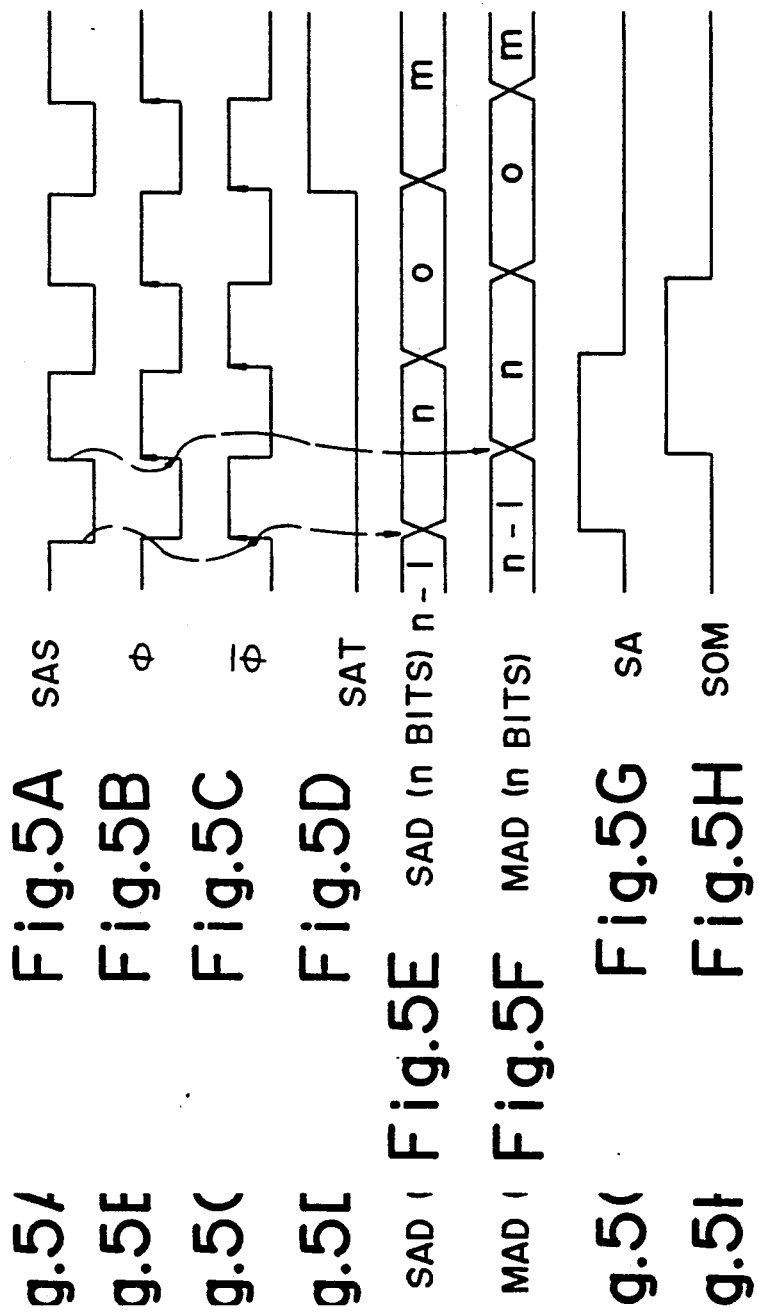
FIGS. 5(A), 5(B), 5(C), 5(D), 5(E), 5(F), 5(G), and 5(H) are timing charts of signals observed in the configuration shown in FIG. 4.

FIG. 4 is a block diagram of a serial access memory in which the column address $C_{AD}$ consists of n bits. Referring to FIG. 4, an address counter 20 is made up of n pairs of the first and second counters 10 and 11. That is, a pair of the first and second counters 10 and 11 is provided for each of the n bits. The address counter 20 outputs the serial access strobe signal SAD consisting of n bits and the master address MAD consisting of n bits. A clock generator 21 generates a clock signal $\Phi$ having the same timing as the serial access strobe signal SAS, and a clock signal $\overline{\Phi}$ obtained by inverting the clock signal $\Phi$.

As shown in FIGS. 5(A), 5(B), 5(C), 5(D), 5(E), 5(F), 5(G), and 5(H), the slave address SAD consisting of n bits is output in synchronism with the rise of the clock signal $\overline{\Phi}$, that is, the fall of the serial access strobe signal SAS. The master address MAD consisting of n bits is output in synchronism with the rise of the clock signal $\Phi$, that is, the rise of the serial access strobe signal SAS. Thus, it is possible to start a necessary internal operation including the redundancy decision procedure before the serial access strobe signal SAS rises. As a result, it is possible to reduce the period of the serial access strobe signal SAS and thus speed up accessing.

In the aforementioned operation, the master address MAD to be supplied to the data register is settled in synchronism with each rise of the serial access strobe signal SAS. Alternatively, it is possible to supply the master address MAD to the data register in synchronism with each fall of the serial access strobe signal SAS.

In some of conventional memory devices, the column address (initial setting address) supplied to the serial access memory is predecoded by a column decoder provided on the side of the RAM, and is divided into groups. A configuration shown in FIG. 6 is suitable for such cases.

Figure 6:
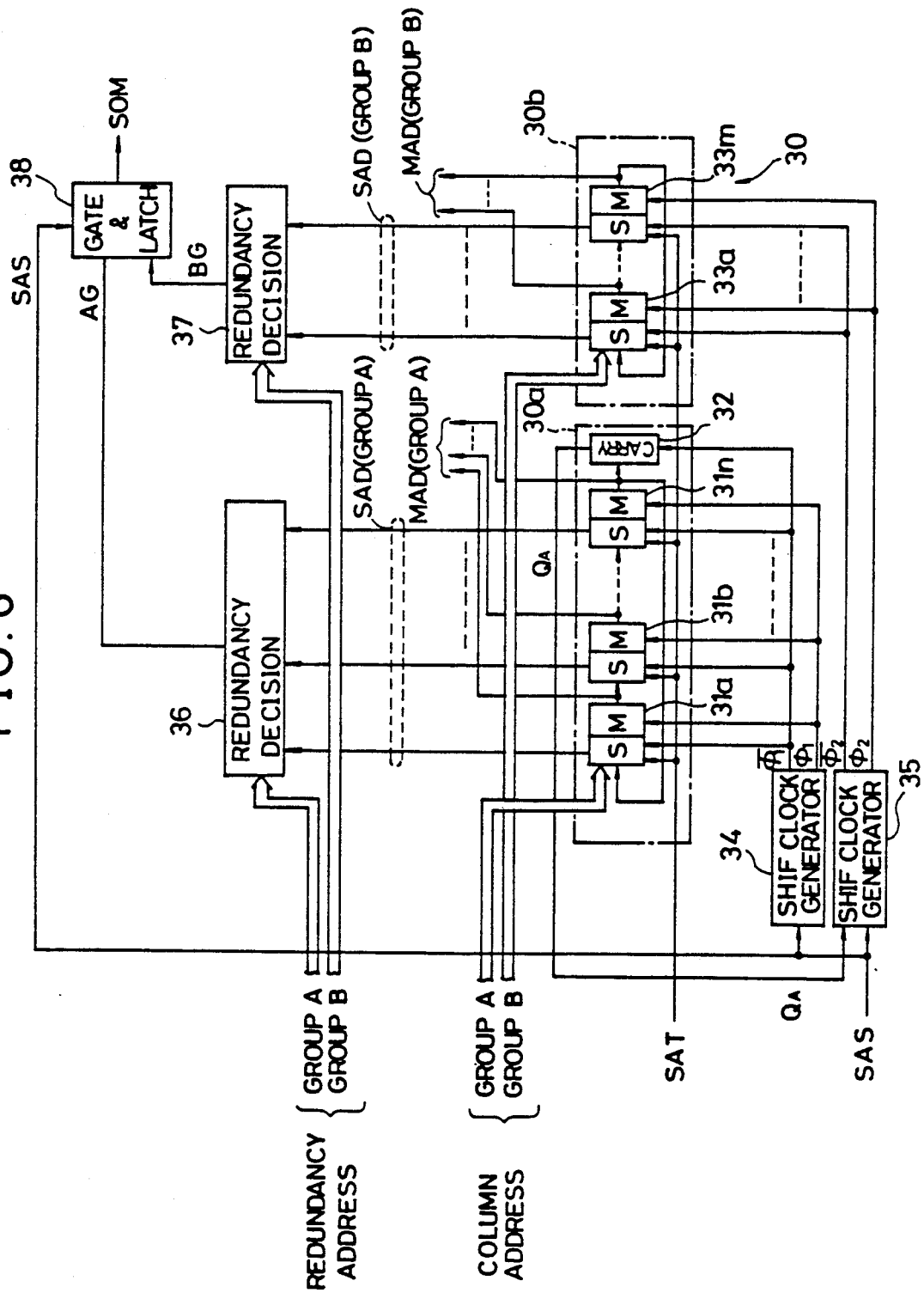
FIG. 6 is a block diagram of a fundamental structure of the present invention where an address signal is divided into groups each consisting of bits.
Figure 7:
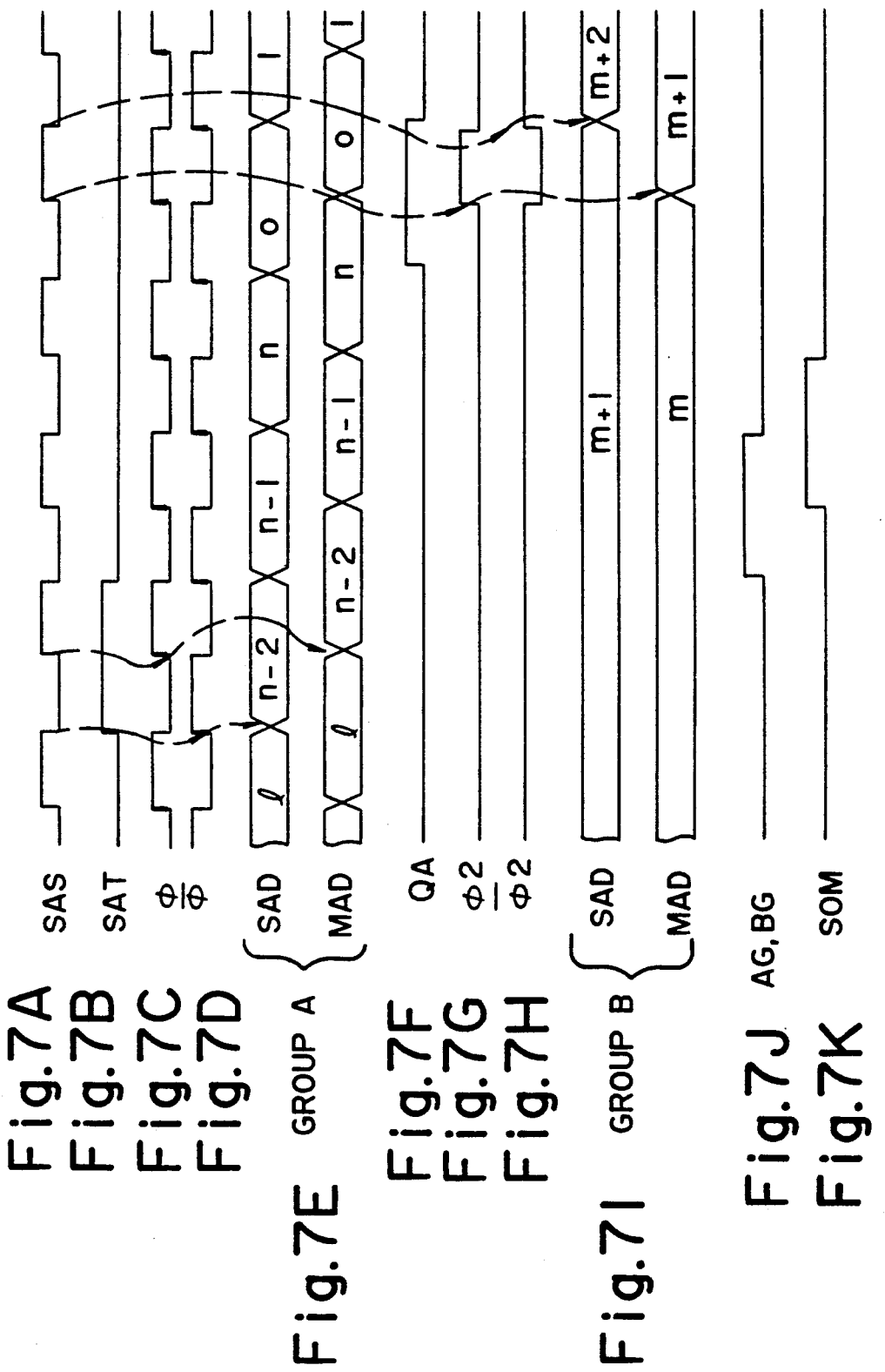
FIGS. 7(A), 7(B), 7(C), 7(D), 7(E), 7(F), 7(G), 7(H), 7(I), 7(J), and 7(K) are timing charts of signals observed in the configuration shown in FIG. 6.

Referring to FIG. 6, an address counter 30 includes a group-A counter 30a for low-order address bits and a group-B counter 30b for high-order address bits. That is, the column address is divided into two groups of group A and group B. The number of groups is not limited to two. The group-A counter 30a includes master-slave type flip-flops 31a–31n which amount to the number of bits contained in the group A, and a carry circuit 32 which outputs a carry $Q_A$ in response to a master output supplied from the flip-flop 31n. A letter 'M' denotes a master part, and a letter 'S' denotes a slave part. The group-B counter 30b includes master-slave type flip-flops 33a–33m amounting to the number of bits contained in the group B. A shift clock generator 34 relates to the group A, and generates a clock signal $\Phi_1$ with the same timing as the serial access strobe signal SAS, and a clock signal $\overline{\Phi}_1$ which is an inverted signal of the signal SAS. A shift clock generator 35 relates to the group B, and generates a clock signal $\Phi_1$ with the same timing as the serial access strobe signal SAS and a clock signal $\overline{\Phi}_1$ which is an inverted signal of the signal SAS each time the carry $Q_A$ is supplied from the carry circuit 32. A redundancy decision circuit 36 is provided with the bits supplied from the slave part of the flip-flops 31a–31n, and a group-A redundancy address supplied from a ROM (not shown) provided in the memory device. A redundancy decision circuit 37 is provided with the bits supplied from the slave part of the flip-flops 33a –33m, and a group-B redundancy address supplied from the ROM. The decision results AG and BG which are derived from the redundancy decision circuits 36 and 37, respectively, are supplied to a gate and latch circuit 38, which outputs the redundancy switching signal SOM based on the results AG and BG when the serial access strobe signal SAS rises.

Referring to FIGS. 7(A), 7(B), 7(C), 7(D), 7(E), 7(F), 7(G), 7(H), 7(I), 7(J), and 7(K), the slave address SAD related to the group A is renewed each time the clock signal $\overline{\Phi}_1$ rises, that is, the serial access strobe signal SAS falls. The master address MAD related to the group A is renewed each time the clock signal $\Phi_1$ rises, that is, the serial access strobe signal SAS rises. When the group-A counter 30a makes a round of counting, the carry circuit 32 outputs the carry $Q_A$. In response to the carry $Q_A$, the slave address SAD related to the group B is renewed when the clock signal $\overline{\Phi}_2$ rises, that is, when the serial access strobe signal SAS falls, and the master address MAD related to the group B is renewed when the clock signal $\Phi_2$ rises, that is, the serial access strobe signal SAS rises.

Figure 8:
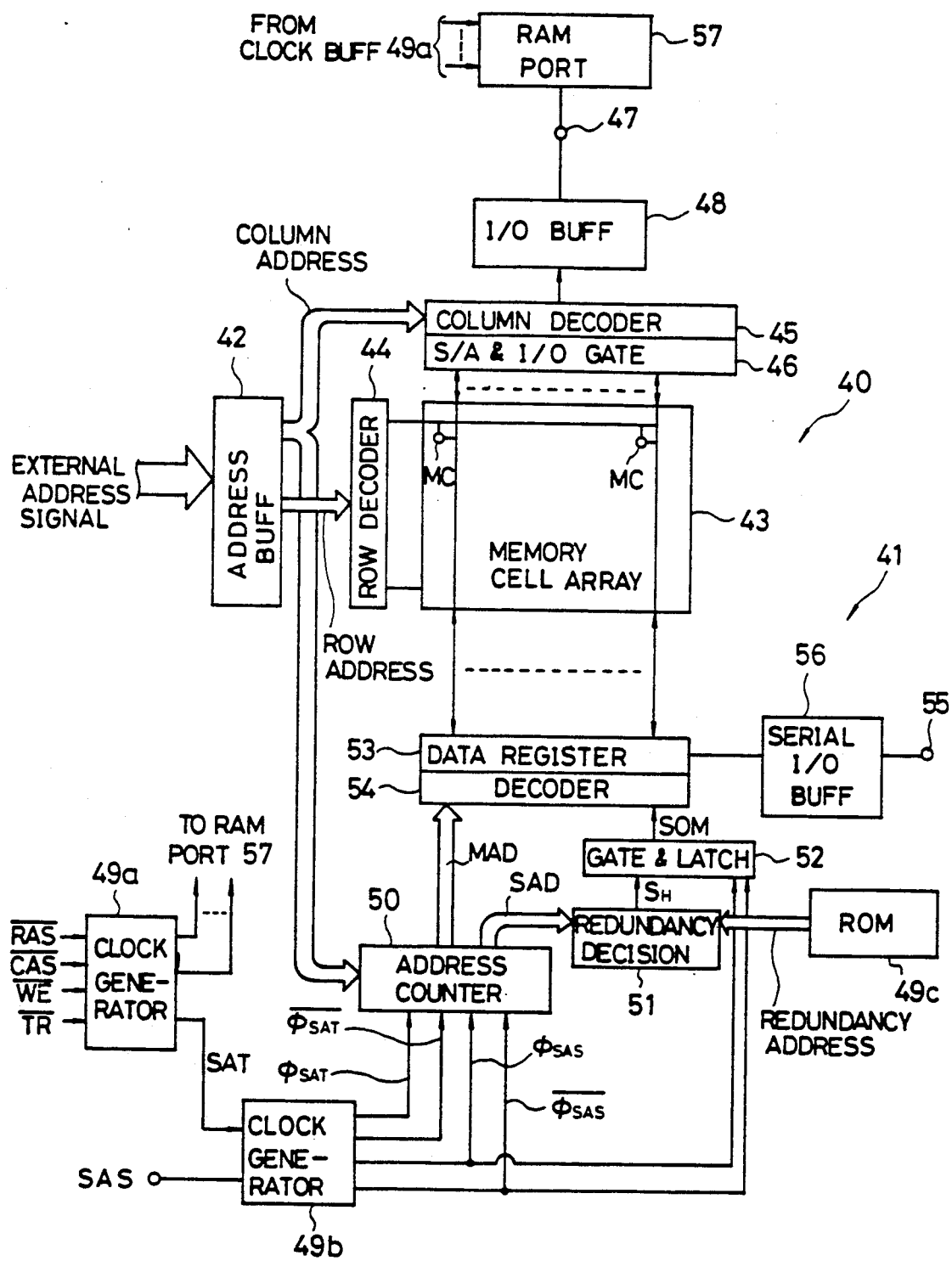
FIG. 8 is a block diagram of the entire structure of a semiconductor memory device according to a preferred embodiment of the present invention.

FIG. 8 is a diagram of the entire structure of a semiconductor memory device according to a preferred embodiment of the present invention. Referring to FIG. 8, the memory device includes a RAM 40 and a SAM (serial access memory) 41. The RAM 40 is configured as follows. The RAM 40 is supplied with an external address signal which has been multiplexed. An address buffer 42 receives the external address signal and separately outputs a row address signal and a column address signal. A row decoder 44 decodes the row address signal, and selects one word line from among a plurality of word lines provided in a memory cell array where a plurality of memory cells MC are arranged in an array. Some of the memory cells are redundancy cells located at a predetermined area in the memory cell array 43. The redundancy cells are replaceable with (i.e., used in place of) defective cells in the memory cell array 43. A column decoder 45 decodes the column address signal, and selects one bit line out of a plurality of bit lines in the memory cell array 43. A sense amplifier and I/O gate 46 amplifies the potential of the selected bit line, and performs data reading and writing. An input/output buffer 48 is interposed between a random input/output terminal 47 and the sense amplifier and I/O gate 46 and passes parallel data in the bidirection.

A clock generator 49a is supplied from an external device such as a CPU with a row address strobe signal $\overline{RAS}$, a column address strobe signal $\overline{CAS}$, a write enable signal $\overline{WE}$, and a transfer signal $\overline{TR}$. The transfer signal $\overline{TR}$ instructs the RAM 40 and the SAM 41 to operate in synchronism with each other. The clock generator 49a generates the initial counter address setting signal SAT, which is supplied to a clock generator 49b related to the serial access memory 41. Further, the clock generator 49a generates various control signals, which are supplied to a RAM port 57 coupled to the terminal 47.

On the other hand, the serial access memory (SAM) 41 is configured as follows. The clock generator 49b receives the initial counter address setting signal SAT from the clock generator 49a and the serial access strobe signal supplied from the CPU for example, and generates the following clock signals. That is, the clock generator 49b generates a clock signal $\Phi_{SAT}$ of the same timing as the initial counter address setting signal SAT, a clock signal $\overline{\Phi_{SAT}}$ which is an inverted signal of the signal SAT, a clock signal $\Phi_{SAS}$ having the same timing as the serial access strobe signal SAS, and a clock signal $\overline{\Phi_{SAS}}$ which is an inverted signal of the signal SAS. An address counter 50 receives the column address signal and all the clock signals supplied from the clock generator 49b, and outputs the slave address SAD and the master address MAD. A redundancy decision circuit 51 compares the slave address signal SAD with a redundancy address signal supplied from a read only memory (ROM) 49c, and outputs a redundancy decision signal $S_H$. The redundancy address signal indicates the redundancy cells provided in the memory cell array 43. A gate and latch circuit 52 temporarily stores the redundancy decision circuit $S_H$, and outputs the same as the redundancy switching signal SOM to a decoder 54.

Figure 9:
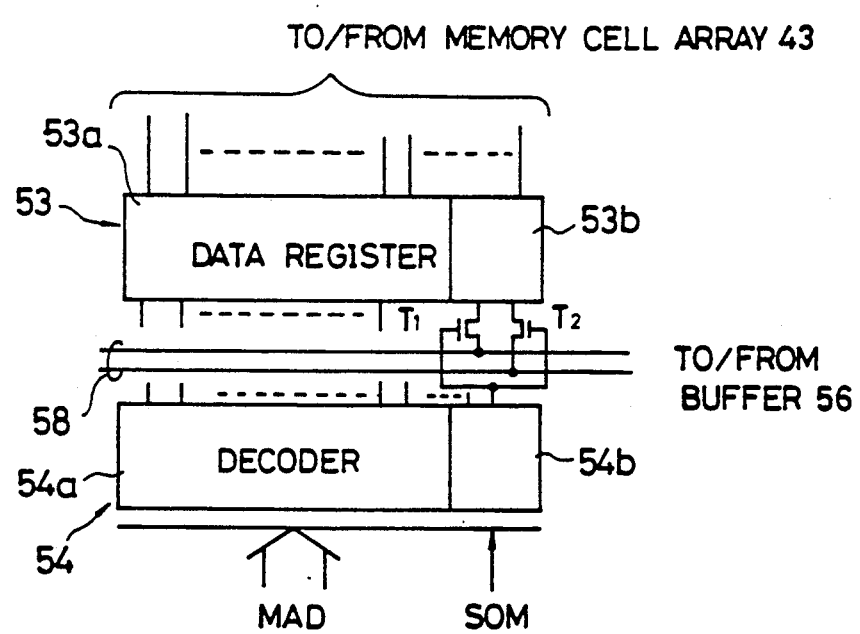
FIG. 9 is a block diagram of a decoder, a data register and a peripheral circuit thereof.

The decoder 54 consists of first and second decoders 54a and 54b as shown in FIG. 9. When the redundancy switching signal SOM is inactive, the first decoder 54a is selected. On the other hand, when the redundancy switching signal SOM is active, the second decoder 54b is selected. Each bit of the decoder output is supplied with the gates of two MOS transistors T1 and T2, which are coupled to corresponding signal lines of a bus 58. A data register 53 has a storage capacity equal to one line of the memory cell array 43, and includes a group 53a of register cells and a group 53b of redundancy register cells, each of which is coupled to a corresponding pair of MOS transistors such as T1 and T2. The redundancy register cells are coupled to the corresponding redundancy cells provided in the memory cell array 43. The decoder 54 selects one of the register cells on the basis of the supplied master address MAD. The data register 53 is connected to the bit lines of the memory cell array 43. Turning to FIG. 8, a serial input/output buffer 56 is interposed between a serial input/output terminal 55 coupled to an external data line (not shown) and the data register 53, and passes serial data in the bidirection.

Figure 10:
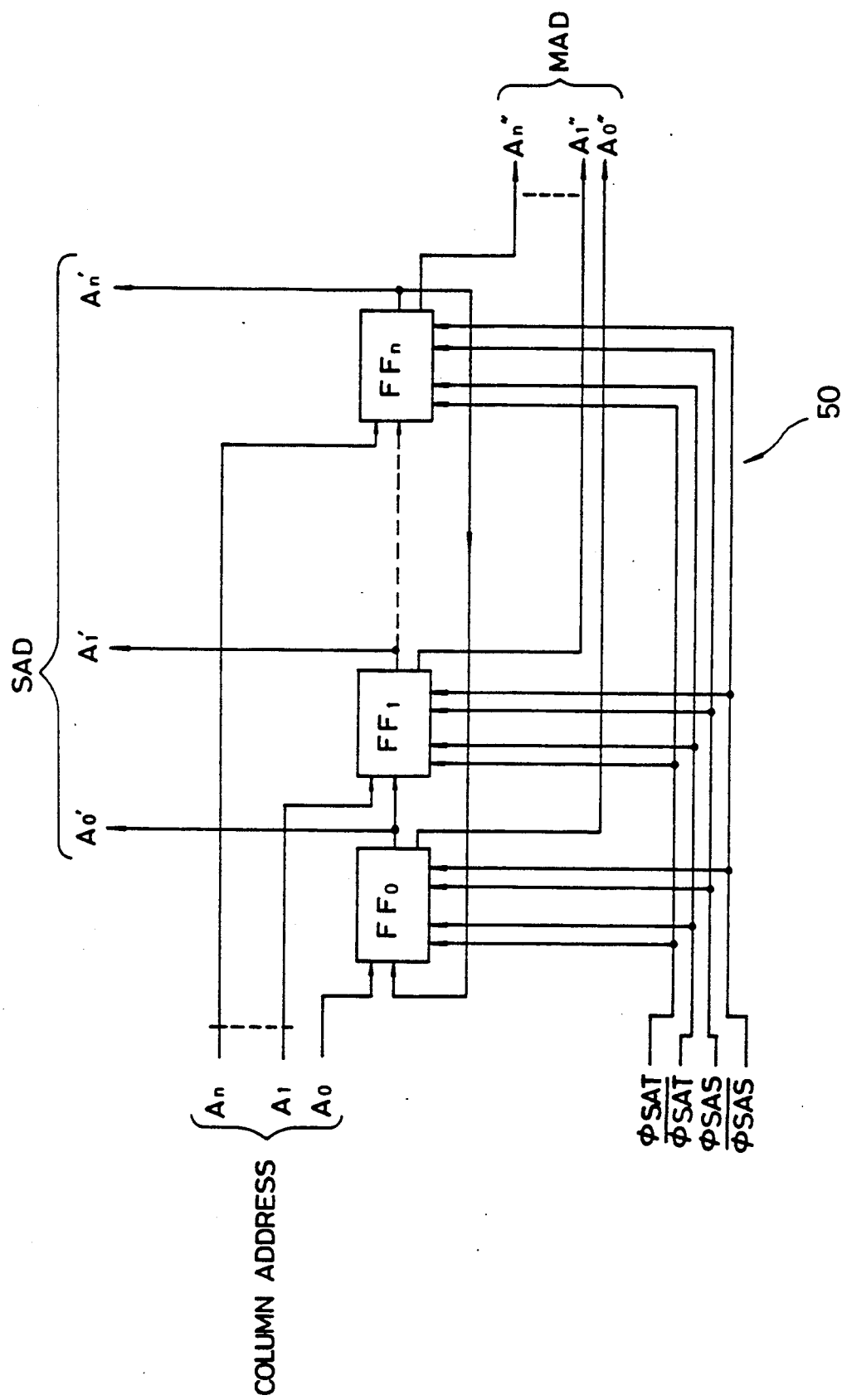
FIG. 10 is a circuit diagram of an address counter used in the embodiment shown in FIG. 8.

FIG. 10 is a circuit diagram of the address counter 50. The address counter 50 is made up of master-slave type flip-flops $FF_0$–$FF_n$ which amount to the number of bits of the column address signal.

Figure 11:
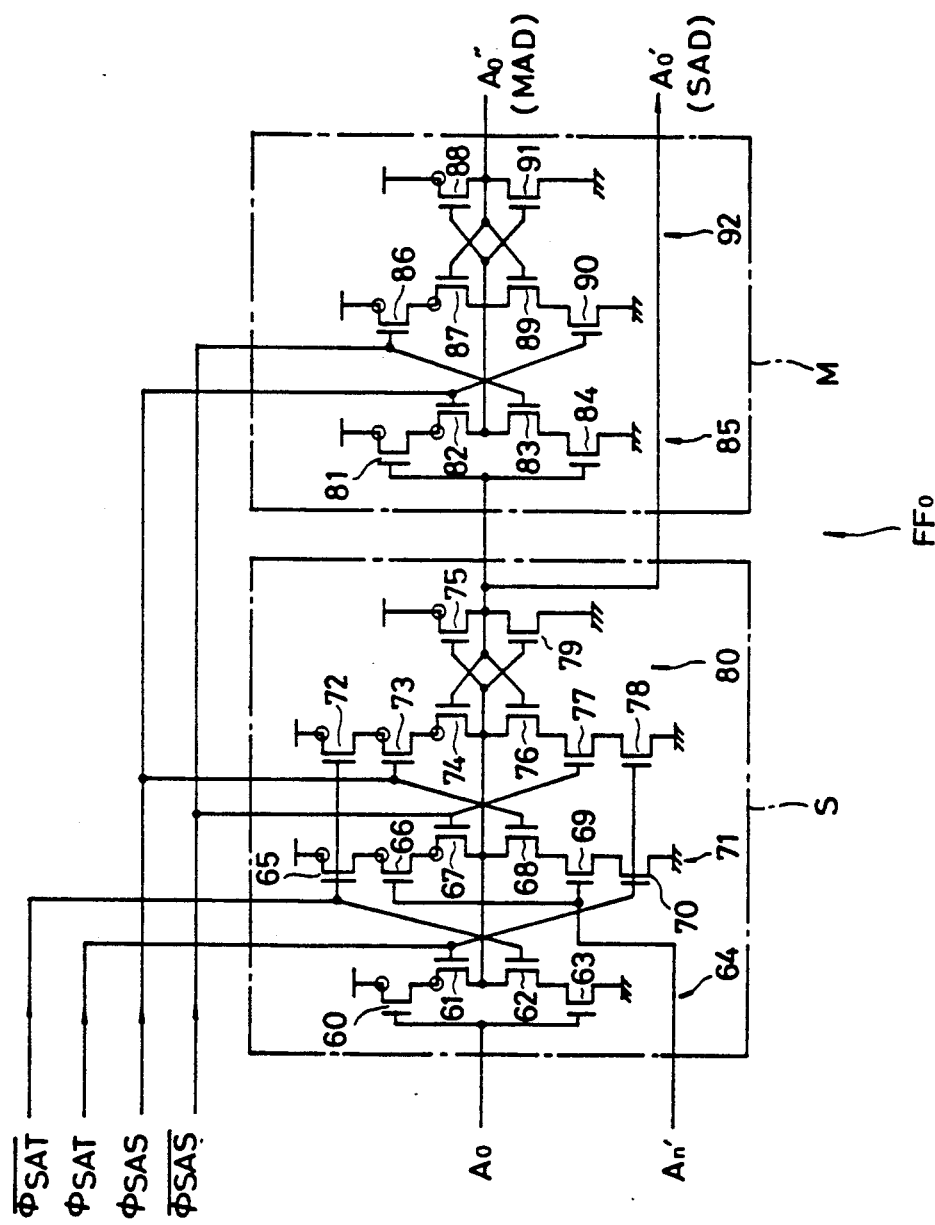
FIG. 11 is a circuit diagram of a flip-flop used in the address counter shown in FIG. 10.

FIG. 11 is a circuit diagram of the master-slave type flip-flop $FF_0$. Each of the other flip-flops $FF_1$–$FF_n$ is configured in the same manner as the flip-flop $FF_0$. A slave part S of the flip-flop $FF_0$ includes a first gate 64, a second gate 71 and a slave-side flip-flop 80. The first gate 64 is made up of two P-channel MOS transistors 60, 61, and two N-channel MOS transistors 62, 63, which are totem pole connected. The second gate 71 is made up of three P-channel MOS transistors 65, 66 and 67, and three N-channel MOS transistors 68, 69 and 70, which are totem pole connected. The slave-side flip-flop 80 is made up of four P-channel MOS transistors 72, 73, 74 and 75, and four N-channel MOS transistors 76, 77, 78 and 79. The first gate 64 inputs a bit $A_0$ of the column address signal when the clock signal $\Phi_{SAT}$ is "L (low)" and the clock signal $\overline{\Phi_{SAT}}$ is "H (high)". The slave-side flip-flop 80 latches the input address bit $A_0$ when the clock signal $\Phi_{SAS}$ switches from "H" to "L" (in other words, the clock signal $\overline{\Phi_{SAS}}$ switches from "L" to "H"), that is, when the serial access strobe signal SAS falls. Then the slave-side flip-flop 80 outputs the latched bit $A_0$ as a bit $A_0'$ (SAD) to a master part M of the flip-flop $FF_0$ and the redundancy decision circuit 51 shown in FIG. 8.

The master part M includes a first gate 85, and a master-side flip-flop 92. The first gate 85 is made up of two P-channel MOS transistors 81, 82, and two N-channel MOS transistors 83, 84, which are totem pole connected. The master-side flip-flop 92 is made up of three P-channel MOS transistors 86, 87 and 88, and three N-channel MOS transistors 89, 90 and 91. The master-side flip-flop 92 latches the bit $A_0'$ from the slave part S, when the clock signal $\Phi_{SAS}$ changes from "L" to "H" (in other words, the clock signal $\overline{\Phi_{SAS}}$ changes from "H" to "L"), that is, when the serial access strobe signal SAS rises. Then the master-side flip-flop 92 outputs the latched bit $A_0'$ as a bit $A_0''$ (MAD) to the decoder 54 (FIG. 8).

Figure 12:
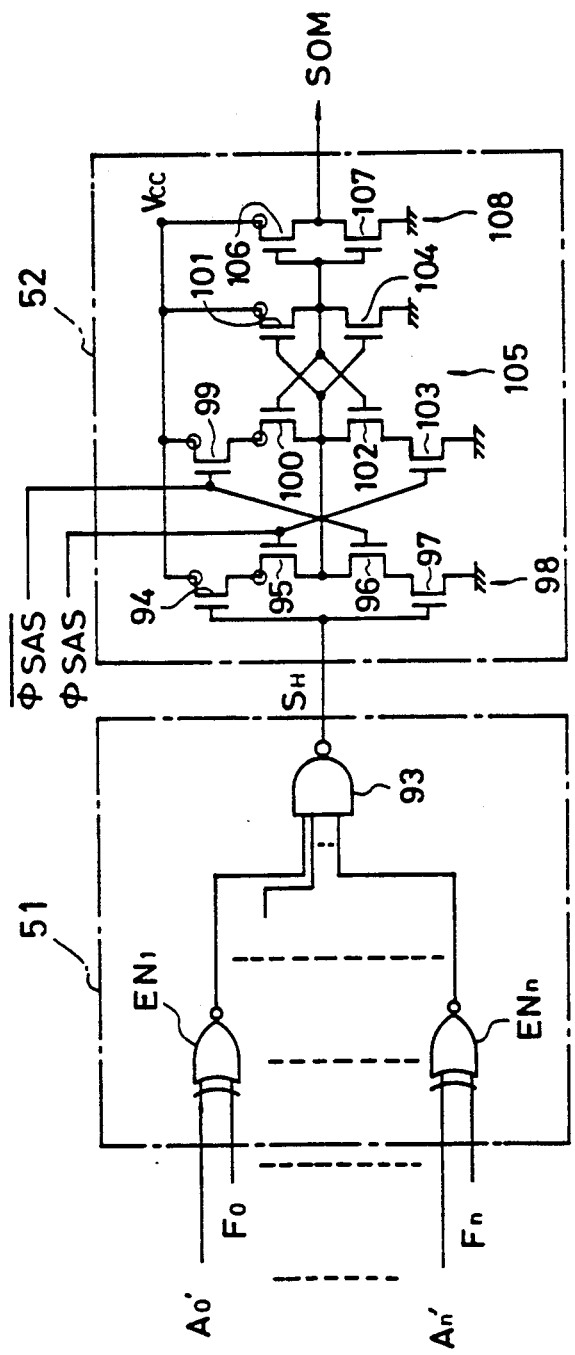
FIG. 12 is a circuit diagram of a redundancy decision circuit and a gate and latch circuit used in the embodiment shown in FIG. 8.

FIG. 12 is a circuit diagram of the redundancy decision circuit 51 and the gate and latch circuit 52. The redundancy decision circuit 51 n exclusive-NOR gates $EN_1$-$EN_n$, a single n-input NAND gate 93. The redundancy decision circuit 51 compares the slave address $SAD(A_0'$-$A_n')$ with the redundancy address (fuse address $F_0$-$F_n$) supplied from the ROM 49c. When both the addresses are the same as each other, the redundancy decision circuit 51 outputs the redundancy decision signal $S_H$. The gate and latch circuit 52 includes a first gate 98, a flip-flop 105 and an output inverter gate 108. The first gate 98 is made up of two P-channel transistors 94, 95 and two N-channel transistors 96, 97, which are totem pole connected. The flip-flop 105 is made up of three P-channel MOS transistors 99, 100 and 101, and three N-channel MOS transistors 102, 103 and 104. The output inverter gate 108 is made up of a P-channel MOS transistor 106 and an N-channel MOS transistor 107. The gate and latch circuit 52 latches the redundancy decision signal $S_H$ from the redundancy decision circuit 51 when the clock signal $\Phi_{SAS}$ changes from "L" to "H" (or the clock signal $\overline{\Phi_{SAS}}$ changes "H" to "L"), that is, when the serial access strobe signal SAS rises. Then the redundancy decision circuit 52 outputs, as the redundancy switching signal SOM, the latched signal $S_H$ to the decoder 54 shown in FIG. 8.

A description is given of an operation of the embodiment. When the serial access to the SAM 41 is requested, the initial counter address setting signal SAT is set to "L". Thereby, the clock signal $\Phi_{SAT}$ is switched to "L" and the clock signal $\overline{\Phi_{SAT}}$ is switched to "H". Thus, the flip-flops $FF_0$-$FF_n$ shown in FIG. 10 input the column address bits $(A_0$-$A_n)$ as the initial address value. The slave part of the address counter 50 latches the address bits $A_0$-$A_n$ in synchronism with a fall of the serial access strobe signal SAS, and simultaneously outputs the slave address SAD $(A_0'$-$A_n')$. The address counter 50 latches the slave address SAD on the master side thereof when the serial access strobe signal SAS rises, and simultaneously outputs the master address MAD $(A_0''$-$A_n'')$. The redundancy decision circuit 51 determines whether the slave address SAD supplied from the address counter 50 coincides with the redundancy address $F_0$-$F_n$. The redundancy decision signal $S_H$ indicative of the comparison result is supplied to the gate and latch circuit 52, which latches the result $S_H$ when the serial access strobe signal SAS rises, and outputs the same as the redundancy stitching signal SOM.

In the aforementioned manner, it is possible to start the internal operation such as address setting for the redundancy decision procedure and the redundancy decision procedure from the fall (rise) of the serial access strobe signal SAS and to complete the same when the signal SAS rises (falls). Thus, the serial access operation can be started when the serial access strobe signal SAS rises (falls). This means that the length of a period of the serial access strobe signal SAS can be reduced and thus the access speed can be increased.

The present invention is not limited to the aforementioned embodiments, and variations and modifications may be made without departing from the scope of the present invention.

What is claimed is:

1. A semiconductor memory device comprising:
   a random access memory including a plurality of memory cells and parallel read/write means for writing data and reading data into and from said memory cells on the basis of address information; and
   a serial access memory coupled to said random access memory,
   said serial access memory comprising:
   data register means for storing data to be written into or read from said random access memory and to be input from or output to an external signal line in serial form, said data register means including a first group of register cells and a second group of redundancy cells;
   first address generating means for generating a first serial access address starting from an initial address supplied from an external device;
   second address generating means, coupled to said first address generating means, for inputting said first serial access address and generating a second serial access address to be supplied to said data register means, said first serial access address having the same contents as said second serial access address and preceding said second serial access address by a predetermined time;
   redundancy decision means, coupled to said first address generating means, for determining whether said first serial access address is the same as a redundancy address; and
   selecting means, coupled to said redundancy decision means, for selecting one of said first and second groups of said data register means on the basis of the comparison result supplied from said redundancy decision means, said data registered in said data register means being accessed in serial form by said second serial access address,
   wherein when said second serial access address is supplied to said data register means, said data is input in or output from said data register means in series.

2. A semiconductor memory device as claimed in claim 1, wherein said first address generating means includes first counter means for inputting said initial access address supplied from the external device in synchronism with a first edge of a pulse signal supplied from the external device and for incrementing said first serial access address in synchronism with the subsequent first edges of said pulse signal, and said second address generating means includes second counter means for outputting said first serial access address as said second serial access address in synchronism with a second edge of said pulse signal following said first edge thereof so that said first serial access address derived from said first address generating means precedes said second serial access address derived from said second address generating means by a difference in time between the first edge and the subsequent second edge of said pulse signal.

3. A semiconductor memory device as claimed in claim 2, wherein said first serial access address precedes said second serial access address by a half of one period of said pulse signal.

4. A semiconductor memory device as claimed in claim 2, wherein said selecting means includes gate and latch means for inputting the comparison result from said redundancy decision means and outputting the same as a redundancy switching signal in synchronism with the second edge of said pulse signal.

5. A semiconductor memory device as claimed in claim 4, wherein said gate and latch means is outputting said redundancy switching signal during one period of said pulse signal from said second edge thereof.

6. A semiconductor memory device as claimed in claim 1, further comprising clock generating means for generating first and second clock pulses which are 180 degrees out of phase with each other, and said first and second address generating means generate said first and second serial access addresses in synchronism with said first and second clock pulses, respectively.

7. A semiconductor memory device as claimed in claim 6, wherein said first address generating means includes a slave flip-flop controlled by said first and second clock signals, and said second address generating means includes a master flip-flop controlled by said first and second clock signals.

8. A semiconductor memory device as claimed in claim 7, wherein said slave flip-flop provided in said first address generating means is connected to said master flip-flop provided in said second address generating means.

9. A semiconductor memory device as claimed in claim 1, wherein said first address generating means includes a plurality of slave flip-flops amounting to the number of bits forming said first serial access address, and said second address generating means includes a plurality of master flip-flops amounting to the number of bits forming said second serial access address.

10. A semiconductor memory device as claimed in claim 1, wherein said first serial access address is composed of n bits (n is an integral), and said redundancy address is composed of n bits, and wherein said redundancy decision means includes logic gate means for corresponding bits of said first serial access address and said redundancy address and for outputting the comparison result.

11. A semiconductor memory device as claimed in claim 10, wherein said logic gate means includes exclusive-NOR gates provided for the respective bits to be compared, and a NAND gate which receives output signals of said exclusive-NOR gates and outputting the comparison result.

12. A semiconductor memory device as claimed in claim 1, further comprising generating means for generating an indication signal, wherein the said first address generating means generates said first serial access address starting form said initial address when said indication signal is supplied to said first address generating means.

13. A semiconductor memory device as claimed in claim 1, wherein said initial address corresponds to a column address to be supplied to said random access memory.

14. A semiconductor memory device as claimed in claim 1, further comprising a read only memory which stores said redundancy address.

15. A semiconductor memory device as claimed in claim 1, wherein said semiconductor memory device is an image memory device which handles image data.

16. A semiconductor memory device as claimed in claim 2, wherein the first edge of said pulse signal is a falling edge and the second edge thereof is a rising edge.

17. A semiconductor memory device comprising:
a random access memory including a plurality of memory cells and parallel read/write means for writing data and reading data into and from said memory cells on the basis of address information; and
a serial access memory coupled to said random access memory,
said address information being divided into groups each composed of a predetermined number of address bits,
said serial access memory comprising:
data register means for storing data to be written into or read from said random access memory and to be input from or output to an external signal line in serial form, said data register means including a first group of register cells and a second group of redundancy cells;
first address generating means, provided for each of said groups of address bits, for generating a part of a first serial access address starting from an initial address for corresponding one of the groups of address bits supplied from an external device;
second address generating means, provided for each of said groups of address bits and coupled to said related first address generating means, for inputting the related part of said first serial access address and generating a part of a second serial access address to be supplied to said data register means, said first serial access address having the same contents as said second serial access address and preceding said second serial access address by a predetermined time;
redundancy decision means, provided for each of said groups of address bits and coupled to said first address generating means, for determining whether the part of said first serial access address is the same as a corresponding part of a redundancy address; and
selecting means, coupled to said redundancy decision means, for selecting one of said first and second groups of said data register means on the basis of the comparison results supplied from said redundancy decision means provided for the groups of address bits, said data registered in said data register means being accessed in serial form by said second serial access address,
wherein when said second serial access address is supplied to said data register means, said data is input in or output from said data register means in series.

18. A semiconductor memory device as claimed in claim 17, wherein said first address generating means includes first counter means for inputting said initial access address supplied from the external device in synchronism with a first edge of a pulse signal supplied from the external device and for incrementing the related part of said first serial access address in synchronism with the subsequent first edges of said pulse signal, and said second address generating means includes second counter means for outputting the related part of said first serial access address as the related part of said second serial access address in synchronism with a second edge of said pulse signal following said first edge thereof so that said first serial access address derived from said first address generating means precedes said second serial access address derived from said second address generating means by a difference in time between the first edge and the subsequent second edge of said pulse signal.

19. A semiconductor memory device as claimed in claim 18, wherein said first serial access address precedes said second serial access address by a half of one period of said pulse signal.

20. A semiconductor memory device as claimed in claim 18, wherein said selecting means includes gate and latch means for inputting the comparison results supplied from all the said redundancy decision means and generating a redundancy switching signal from the input comparison results in synchronism with the second edge of said pulse signal.

* * * * *